(12) United States Patent
Kim et al.

(10) Patent No.: US 12,019,257 B2
(45) Date of Patent: Jun. 25, 2024

(54) ELLIPTICALLY POLARIZING PLATE AND ORGANIC LIGHT-EMITTING DIODE

(71) Applicant: LG CHEM, LTD., Seoul (KR)

(72) Inventors: Sun Kug Kim, Daejeon (KR); Moon Su Park, Daejeon (KR); Hyuk Yoon, Daejeon (KR); Seongho Ryu, Daejeon (KR)

(73) Assignee: LG CHEM, LTD., Seoul (KR)

(*) Notice: Subject to any disclaimer, the term of this patent is extended or adjusted under 35 U.S.C. 154(b) by 948 days.

(21) Appl. No.: 16/982,880

(22) PCT Filed: Apr. 17, 2019

(86) PCT No.: PCT/KR2019/004623
§ 371 (c)(1),
(2) Date: Sep. 21, 2020

(87) PCT Pub. No.: WO2019/203561
PCT Pub. Date: Oct. 24, 2019

(65) Prior Publication Data
US 2021/0003759 A1 Jan. 7, 2021

(30) Foreign Application Priority Data
Apr. 17, 2018 (KR) .................. 10-2018-0044316

(51) Int. Cl.
*G02B 5/30* (2006.01)
*H10K 50/80* (2023.01)

(52) U.S. Cl.
CPC .......... *G02B 5/3041* (2013.01); *H10K 50/868* (2023.02)

(58) Field of Classification Search
None
See application file for complete search history.

(56) References Cited

U.S. PATENT DOCUMENTS

| | | | |
|---|---|---|---|
| 7,605,895 B2 * | 10/2009 | Jeon | G02F 1/134363 349/120 |
| 8,338,823 B2 | 12/2012 | Kim et al. | |
| 8,962,234 B2 | 2/2015 | Ohnishi et al. | |
| 9,500,788 B2 | 11/2016 | Jeon et al. | |
| 10,551,539 B2 | 2/2020 | Jeon et al. | |
| 2009/0257012 A1 | 10/2009 | Sabae et al. | |
| 2010/0026936 A1 | 2/2010 | Uesaka et al. | |
| 2014/0340617 A1 * | 11/2014 | Yanai | G02F 1/133634 349/96 |

FOREIGN PATENT DOCUMENTS

| | | |
|---|---|---|
| CN | 1932561 A | 3/2007 |
| JP | 2008-134546 A | 6/2008 |
| JP | 2008-152219 A | 7/2008 |
| JP | 2009-042254 A | 2/2009 |
| JP | 2009-192611 A | 8/2009 |
| JP | 2014-228567 A | 12/2014 |

(Continued)

*Primary Examiner* — Evren Seven
(74) *Attorney, Agent, or Firm* — Bryan Cave Leighton Paisner LLP (57) ABSTRACT

An elliptically polarizing plate and an organic light-emitting device. The elliptically polarizing plate provides superior visibility, and excellent reflection characteristics and color characteristics on the side as well as the front of a device, and an organic light-emitting device comprising the same.

18 Claims, 1 Drawing Sheet

(56) References Cited

FOREIGN PATENT DOCUMENTS

| | | |
|---|---|---|
| JP | 2015-501955 A | 1/2015 |
| JP | 2015-106114 A | 6/2015 |
| JP | 2017-173672 A | 9/2017 |
| JP | 2019-530014 A | 10/2019 |
| JP | 2021-516789 A | 7/2021 |
| JP | 2021-516792 A | 7/2021 |
| JP | 2021-516795 A | 7/2021 |
| KR | 10-2009-0122138 A | 11/2009 |
| KR | 10-2011-0066255 A | 6/2011 |
| KR | 10-2017-0008478 A | 1/2017 |
| KR | 10-2017-0058894 A | 5/2017 |
| KR | 10-2017-0117961 A | 10/2017 |
| TW | 201339661 A | 10/2013 |
| TW | I561864 B | 5/2016 |

\* cited by examiner

ELLIPTICALLY POLARIZING PLATE AND ORGANIC LIGHT-EMITTING DIODE

CROSS-REFERENCE TO RELATED APPLICATIONS

The present application is a U.S. national stage of international Application No. PCT/KR2019/004623 filed on Apr. 17, 2019, and claims the benefit of priority based on Korea Patent Application No. 10-2018-0044316 filed on Apr. 17, 2018, the disclosures of which are incorporated herein by reference in their entirety.

FIELD

The present application relates to an elliptically polarizing plate and an organic light-emitting device.

BACKGROUND

Recently, there has been a demand for weight reduction and thinning of monitors, televisions, and the like, and organic light-emitting devices (OLEDs) have been attracting attention in response to this demand. An organic light-emitting device is a self-luminescent display device emitting light by itself, which requires no separate backlight, so that the thickness can be reduced, and is advantageous to realize a flexible display device.

On the other hand, an organic light-emitting device can reflect external light from the metal electrode and the metal wiring formed on the organic light-emitting display panel, whereby visibility and a contrast ratio can be lowered due to the reflected external light, thereby deteriorating the display quality. A circularly polarizing plate can be attached to one side of the organic light-emitting display panel, as in Patent Document 1 (Korean Laid-Open Patent Publication No. 2009-0122138), to reduce leakage of the reflected external light to the outside.

However, the currently developed circularly polarizing plate has strong viewing angle dependence, and thus an antireflection performance deteriorates toward the side, so that there is a problem that the visibility is lowered.

SUMMARY

The present application provides an elliptically polarizing plate with superior visibility having excellent reflection characteristics and color characteristics on the side as well as the front, and an organic light-emitting device comprising the same.

Figure 1:
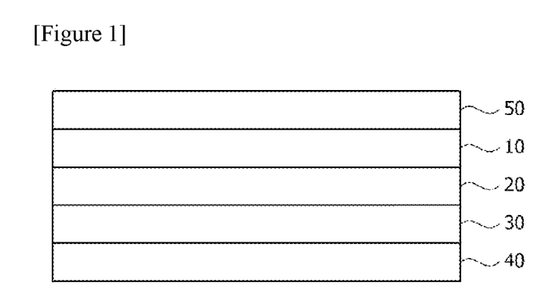
FIG. 1 is an exemplary illustration of a cross-section of an elliptically polarizing plate according to one example of the present application.

The present application relates to an elliptically polarizing plate. FIG. 1 illustrates a structure of an elliptically polarizing plate according to an exemplary embodiment of the present application. As illustrated in FIG. 1, the elliptically polarizing plate can comprise, sequentially, a linear polarizer (50), a first retardation film (10), a second retardation film (20), a third retardation film (30) and a fourth retardation film (40).

DETAILED DESCRIPTION

In this specification, a polarizer means an element exhibiting selective transmission and absorption characteristics with respect to incident light. For example, the polarizer can transmit light that vibrates in any one direction from incident light that vibrates in various directions, and absorb light that vibrates in the other directions.

In this specification, a linear polarizer means a polarizer in which the selectively transmitting light is a linearly polarized light that vibrates in any one direction and the selectively absorbing light is a linearly polarized light that vibrates in a direction orthogonal to the vibration direction of the linearly polarized light.

As the linear polarizer, for example, a polarizer in which iodine is dyed on a polymer stretched film such as a PVA stretched film, or a guest-host polarizer in which a liquid crystal polymerized in an oriented state is used as a host and an anisotropic dye arranged depending on the orientation of the liquid crystal is used as a guest, can be used, without being limited thereto.

According to one example of the present application, a PVA stretched film can be used as the linear polarizer. The transmittance or polarization degree of the linear polarizer can be appropriately adjusted in consideration of the objective of the present application. For example, the transmittance of the linear polarizer can be from 42.5% to 55%, and the polarization degree can be from 65% to 99.9997%.

In this specification, when terms such as vertical, horizontal, orthogonal or parallel are used while defining an angle, it means substantially vertical, horizontal, orthogonal, or parallel to the extent that the desired effect is not impaired, which includes, for example, an error that takes a production error or a deviation (variation), and the like, into account. For example, each case of the foregoing can include an error within about ±15 degrees, an error within about ±10 degrees or an error within about ±5 degrees.

In this specification, the retardation film is an optically anisotropic element, which means an element capable of converting incident polarized light by controlling birefringence. While describing an x-axis, y-axis and z-axis of the retardation film herein, unless otherwise specified, the x-axis means a direction parallel to an in-plane slow axis of the retardation film, the y-axis means a direction parallel to an in-plane fast axis of the retardation film, and the z-axis means a thickness direction of the retardation film. The x-axis and y-axis can be orthogonal to each other in a plane. An optical axis of the retardation film herein, unless otherwise specified, means a slow axis. When the retardation film comprises rod-shaped liquid crystal molecules, the slow axis means the long axis direction of the rod shape, and when it comprises disc-shaped liquid crystal molecules, the slow axis means the normal direction of the disc shape.

In this specification, the Nz value of the retardation film is calculated by the following Equation 1:

$$Nz=(nx-nz)/(nx-ny).  \quad \text{[Equation 1]}$$

In this specification, the retardation film satisfying the following Expression 1 can be a so-called +C plate.

In this specification, the retardation film satisfying the following Expression 2 can be a so-called +B plate.

In this specification, the retardation film satisfying the following Expression 3 can be a so-called −B plate.

In this specification, the retardation film satisfying the following Expression 4 can be a so-called +A plate.

$$nx=ny<nz. \quad \text{[Expression 1]}$$

$$ny<nx\neq nz. \quad \text{[Expression 2]}$$

$$nx>ny>nz. \quad \text{[Expression 3]}$$

$$nx>ny=nz. \quad \text{[Expression 4]}$$

In this specification, the thickness direction retardation value (Rth) of the retardation film is calculated by the following Equation 2.

In this specification, the in-plane retardation value (Rin) of the retardation film is calculated by the following Equation 3.

$$Rth=(nz-ny)\times d. \quad \text{[Equation 2]}$$

$$Rin=(nx-ny)\times d. \quad \text{[Equation 3]}$$

In Equations 1 to 3 and Expressions 1 to 4, nx, ny and nz are refractive indexes in x-axis, y-axis and z-axis directions as defined above, respectively, and d is the thickness of the retardation film.

In this specification, the reverse wavelength dispersion characteristic means a characteristic satisfying the following Equation 4, the normal wavelength dispersion characteristic means a characteristic satisfying the following Equation 5, and the flat wavelength dispersion characteristic means a characteristic satisfying the following Equation 6:

$$R(450)/R(550)<R(650)/R(550); \quad \text{[Equation 4]}$$

$$R(450)/R(550)>R(650)/R(550); \quad \text{[Equation 5]}$$

$$R(450)/R(550)=R(650)/R(550). \quad \text{[Equation 6]}$$

The refractive index of the retardation film as described herein means a refractive index for light of a wavelength of about 550 nm, unless otherwise specified. Here, R ($\lambda$) means an in-plane retardation value or thickness direction retardation value for light with $\lambda$ nm.

The present application can realize an elliptically polarizing plate having superior visibility on the side as well as the front by controlling the optical properties of the first retardation film, the second retardation film, the third retardation film and the fourth retardation film. As one example, the elliptically polarizing plate of the present application can have a color difference maximum value of less than 2.8, less than 2.7, less than 2.6, less than 2.5, or less than 2.4 at a tilt angle of 40 degrees and an azimuth angle of 45 degrees or 135 degrees. In this specification, the color difference means how the color of the side differs from the color of the front when the elliptically polarizing plate has been applied to an organic light-emitting display panel, which means a value $\Delta E^*_{ab}$ in color characteristic simulation evaluation of the examples described herein.

The first retardation film can be a −B plate having an Nz value of more than 1. The Nz value can be, specifically, 1.15 or more, or 1.2 or more. The upper limit of the Nz value can be, specifically, 20 or less, 15 or less, 10 or less, 8 or less, or 6 or less. When the Nz value of the first retardation film satisfies the above range, it exhibits excellent reflection characteristics and color characteristics on the side as well as the front, whereby it can be advantageous to realize an elliptically polarizing plate having superior visibility.

The in-plane retardation value of the first retardation film for light with a wavelength of 550 nm can be 10 nm to 90 nm. The in-plane retardation value can be, specifically, 10 nm or more, 15 nm or more, 20 nm or more, 25 nm or more, or 30 nm or more, and can be 90 nm or less, 85 nm or less, 80 nm or less, 75 nm or less, or 70 nm or less. When the in-plane retardation value of the first retardation film satisfies the above range, it exhibits excellent reflection characteristics and color characteristics on the side as well as the front, whereby it can be advantageous to realize an elliptically polarizing plate having superior visibility.

The thickness direction retardation value of the first retardation film can be −160 nm to −5 nm. The thickness direction retardation value can be, specifically, −160 nm or more, −155 nm or more, or −150 nm or more, and can be −5 nm or less, −8 nm or less, −10 nm or less, or −10.5 nm or less. When the thickness direction retardation value of the first retardation film satisfies the above range, it exhibits excellent reflection characteristics and color characteristics on the side as well as the front, whereby it can be advantageous to realize an elliptically polarizing plate having superior visibility.

In the first retardation film, the in-plane slow axis can be perpendicular to the absorption axis of the linear polarizer. As a result, it exhibits excellent reflection characteristics and color characteristics on the side as well as the front, whereby it can be advantageous to realize an elliptically polarizing plate having superior visibility.

The second retardation film can be a +B plate in which the Nz value of Equation 1 is less than 0 or a +C plate satisfying Expression 1. In the case of the +C plate satisfying Expression 1, the value of Nz=(nx−nz)/(nx−ny) is not defined because nx=ny.

When the second retardation film is a +B plate, the Nz value can be, specifically, less than 0, −0.2 or less, −0.4 or less, −0.6 or less, or −1 or less. The lower limit of the Nz value can be, specifically, −50 or more, −40 or more, −30 or more, or −20 or more. When the Nz value of the second retardation film satisfies the above range, it exhibits excellent reflection characteristics and color characteristics on the side as well as the front, whereby it can be advantageous to realize an elliptically polarizing plate having superior visibility.

When the second retardation film is a +B plate, the in-plane retardation value for light with a wavelength of 550 nm can be 0 nm to 60 nm. The in-plane retardation value can be, specifically, 1 nm or more, 2 nm or more, 3 nm or more, or 3.2 nm or more, and can be 60 nm or less, 55 nm or less, 50 nm or less, or 45 nm or less. When the in-plane retardation value of the second retardation film satisfies the above range, it exhibits excellent reflection characteristics and color characteristics on the side as well as the front, whereby it can be advantageous to realize an elliptically polarizing plate having superior visibility.

When the second retardation film is a +B plate, the thickness direction retardation value can be 30 nm to 120 nm. The thickness direction retardation value can be, specifically, 30 nm or more, 40 nm or more, 50 nm or more, 60 nm or more, 65 nm or more, or 68 nm or more, and can be 120 nm or less, 110 nm or less, 100 nm or less, or 90 nm or less. When the thickness direction retardation value of the second retardation film satisfies the above range, it exhibits excellent reflection characteristics and color characteristics on the side as well as the front, whereby it can be advantageous to realize an elliptically polarizing plate having superior visibility.

When the second retardation film is a +B plate, the in-plane slow axis can be perpendicular or parallel to the absorption axis of the linear polarizer. As a result, it exhibits excellent reflection characteristics and color characteristics on the side as well as the front, whereby it can be advantageous to realize an elliptically polarizing plate having superior visibility.

When the second retardation film is a +C plate, the thickness direction retardation value can be 10 nm to 300 nm. The thickness direction retardation value can be, specifically, 10 nm or more, 20 nm or more, 30 nm or more, 40 nm or more, 50 nm or more, 60 nm or more, or 65 nm or more, and can be 300 nm or less, 290 nm or less, 280 nm or less, 270 nm or less, 260 nm or less, or 255 nm or less. When the thickness direction retardation value of the second retardation film satisfies the above range, it exhibits excellent reflection characteristics and color characteristics on the side as well as the front, whereby it can be advantageous to realize an elliptically polarizing plate having superior visibility.

In the present application, first to third examples can be implemented depending on the second retardation film. According to the first example of the present application, the second retardation film can be a +C plate. According to the second example of the present application, the second retardation film can be a +B plate, and the slow axis can be parallel to the absorption axis of the linear polarizer. According to the third example of the present application, the second retardation film can be a +B plate, and the slow axis can be perpendicular to the absorption axis of the linear polarizer.

The sum of the thickness direction retardation value of the first retardation film and the thickness direction retardation value of the second retardation film can be −100 nm to 130 nm. The sum can be, specifically, −100 nm or more, −95 nm or more, −90 nm or more, −85 nm or more, or −80 nm or more, and can be 130 nm or less, 125 nm or less, 120 nm or less, 110 nm or more, or 105 nm or less. As a result, it exhibits excellent reflection characteristics and color characteristics on the side as well as the front, whereby it can be advantageous to realize an elliptically polarizing plate having superior visibility.

The third retardation film can have an Nz value of 0.8 to 1.2. The third retardation film can be a +B plate, a −B plate, or a +A plate. When the Nz value of the third retardation film is 1.0, it is a +A plate; when the value is 0.8 or more to less than 1.0, it is a +B plate close to the +A plate; and when the value is more than 1.0 to less than 1.2, it is a −B plate close to the +A plate.

The third retardation film can have a quarter-wave phase retardation characteristic. In this specification, the term "n-wave phase retardation characteristic" means a characteristic that the incident light can be phase-delayed by n times the wavelength of the incident light within at least a part of the wavelength range. Therefore, the quarter-wave phase retardation characteristic means a characteristic that the incident light can be phase-delayed by a quarter times the wavelength of the incident light within at least a part of the wavelength range.

The in-plane retardation value of the third retardation film for light having a wavelength of 550 nm can be 120 nm to 160 nm, specifically, 130 nm to 150 nm. When the in-plane retardation value of the third retardation film satisfies the above range, it exhibits excellent reflection characteristics and color characteristics on the side as well as the front, whereby it can be advantageous to realize an elliptically polarizing plate having superior visibility.

The in-plane slow axis of the third retardation film can form an angle of about 40 degrees to about 50 degrees, about 43 degrees to about 47 degrees, specifically, about 45 degrees with the absorption axis of the linear polarizer. As a result, it exhibits excellent reflection characteristics and color characteristics on the side as well as the front, whereby it can be advantageous to realize an elliptically polarizing plate having superior visibility.

The fourth retardation film can be a +C plate or a +B plate. When the fourth retardation film is a +B plate, the Nz value can be −4.0 or less. When the Nz value of the fourth retardation film is −4.0 or less, it can be a +B plate close to the +C plate. The lower limit of the Nz value in the fourth retardation film can be, for example, −3000 or more. When the fourth retardation film is a +C plate, the value of Nz=(nx-nz)/(nx-ny) can not be defined because nx=ny.

When the fourth retardation film is a +B plate, the in-plane slow axis can form an angle from about 40 degrees to 50 degrees, about 43 degrees to 47 degrees, specifically, about 45 degrees with the light absorption axis of the linear polarizer. As a result, it exhibits excellent reflection characteristics and color characteristics on the side as well as the front, whereby it can be advantageous to realize an elliptically polarizing plate having superior visibility.

The fourth retardation film can have a thickness direction retardation value of 0 nm or more. Specifically, the thickness direction retardation value of the fourth retardation film can be 0 nm to 300 nm. More specifically, the thickness direction retardation value of the fourth retardation film can be 0 nm or more, 10 nm or more, 20 nm or more, 30 nm or more, 50 nm or more, or 65 nm or more, and can be 300 nm or less, 250 nm or less, 200 nm or less, 150 nm or less, 100 nm or less, or 75 nm or less. When the thickness direction retardation value of the fourth retardation film satisfies the above range, it exhibits excellent reflection characteristics and color characteristics on the side as well as the front, whereby it can be advantageous to realize an elliptically polarizing plate having superior visibility.

The first to fourth retardation films can each have a reverse wavelength dispersion characteristic, a normal wavelength dispersion characteristic or a flat wavelength dispersion characteristic. In one example, the first retardation film can have an R (450)/R (550) value of 0.6 to 1.3. In one example, the second retardation film can have an R (450)/R (550) value of 0.6 to 1.3, or Rth (450)/Rth (550) of 0.6 to 1.3. In one example, the third retardation film can have an R (450)/R (550) value of 0.60 to 1.0, specifically, 0.6 to 0.99 or 0.6 to 0.92. The R (650)/R (550) value of the third retardation film can be 1.01 to 1.19, 1.05 to 1.15, or 1.09 to 1.11, while having a value greater than the R (450)/R (550) value. In one example, the fourth retardation film can have Rth (450)/Rth (550) of 0.6 to 1.3. Here, R (λ) means an in-plane retardation value of a retardation film for light with λ nm, and Rth (λ) means a thickness direction retardation value of a retardation film for light with λ nm. When the wavelength dispersion characteristics of the first to fourth retardation films are within the above ranges, it exhibits excellent reflection characteristics and color characteristics on the side as well as the front, whereby it can be advantageous to realize an elliptically polarizing plate having superior visibility.

The first to fourth retardation films can each be a polymer film or a liquid crystal film. As the polymer film, a film comprising polyolefin such as PC (polycarbonate), norbornene resin, PVA (poly(vinyl alcohol)), PS (polystyrene), PMMA (poly(methyl methacrylate) and PP (polypropylene), Par (poly(arylate)), PA (polyamide), PET (poly(ethylene terephthalate)) or PS (polysulfone), and the like can be used. The polymer film can be stretched or shrunk under appropriate conditions to impart birefringence and used as the first to fourth retardation films. The liquid crystal film can comprise liquid crystal molecules in a state of being oriented and polymerized. The liquid crystal molecule can be a polymerizable liquid crystal molecule. In this specification, the polymerizable liquid crystal molecule means a molecule containing a moiety capable of exhibiting liquid crystallinity, such as a mesogen skeleton, and containing at least one polymerizable functional group. Also, comprising polymerizable liquid crystal molecules in a polymerized form means a state in which the liquid crystal molecules are polymerized to form a skeleton such as a main chain or side chain of the liquid crystal polymer in the liquid crystal film.

The thicknesses of the first to fourth retardation films can be each appropriately adjusted in consideration of the object of the present application. For example, the thicknesses of the first to fourth retardation films can be each independently 0.1 μm to 100 μm.

The elliptically polarizing plate can further comprise a surface treatment layer. The surface treatment layer can be exemplified by an antireflection layer or the like. The surface treatment layer can be disposed on the outer side of the linear polarizer, for example, on the opposite side where the first retardation film is disposed. As the antireflection layer, a laminate of two or more layers having different refractive indexes or the like can be used, without being limited thereto.

In the elliptically polarizing plate, the first retardation film, the second retardation film, the third retardation film, the fourth retardation film and the linear polarizer can be attached to each other through a pressure-sensitive adhesive or an adhesive, or can be laminated to each other by direct coating. An optical transparent pressure-sensitive adhesive or adhesive can be used as the pressure-sensitive adhesive or adhesive.

The elliptically polarizing plate of the present application can prevent the reflection of external light, thereby improving the visibility of the organic light-emitting device. While incident unpolarized light (hereinafter referred to as "external light") incident from the outside passes through a linear polarizer, one polarized orthogonal component, that is, a first polarized orthogonal component, of two polarized orthogonal components can be only transmitted and the polarized light can be changed to circularly polarized light while passing through the third retardation film. While the circularly polarized light is reflected from a display panel of an organic light-emitting display device comprising a substrate, an electrode, and the like, the rotational direction of the circularly polarized light is changed and the circularly polarized light is converted to the other polarized orthogonal component of two polarized orthogonal components, that is, a second polarized orthogonal component while passing through the third retardation film again. The second polarized orthogonal component does not pass through the linear polarizer and thus does not emit light to the outside, so that it can have an effect of preventing reflection of external light.

The elliptically polarizing plate of the present application can also effectively prevent the reflection of external light incident from, particularly, the side, thereby improving the lateral visibility of the organic light-emitting device. For example, the elliptically polarizing plate of the present application can also effectively prevent the reflection of external light incident from the side through viewing angle polarization compensation principle.

Figure 2:
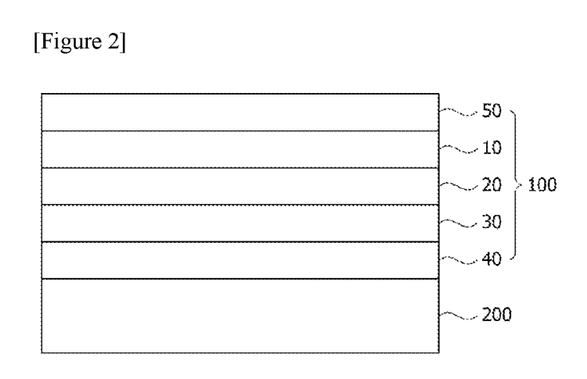
FIG. 2 is an exemplary illustration of a cross-section of an organic light-emitting device according to one example of the present application.

The elliptically polarizing plate of the present application can be applied to an organic light-emitting device. FIG. 2 is a cross-sectional illustration of an organic light-emitting device to which the elliptically polarizing plate of the present application is applied according to an exemplary embodiment. As illustrated in FIG. 2, the organic light-emitting device comprises an organic light-emitting display panel (200) and an elliptically polarizing plate (100) positioned on one side of the organic light-emitting display panel (200). The fourth retardation film (40) of the elliptically polarizing plate can be disposed adjacent to the organic light-emitting display panel (200) as compared with the linear polarizer (50).

The organic light-emitting display panel can comprise a base substrate, a lower electrode, an organic light-emitting layer, an upper electrode and a sealing substrate, and the like. One of the lower electrode and the upper electrode can be an anode and the other can be a cathode. The anode is an electrode into which holes are injected, which can be made of a conductive material having a high work function, and the cathode is an electrode into which electrons are injected, which can be made of a conductive material having a low work function. At least one of the lower electrode and the upper electrode can be made of a transparent conductive material such that the emitted light can come out to the outside, and can be, for example, ITO or IZO. The organic light-emitting layer can comprise an organic material capable of emitting light when a voltage has been applied to the lower electrode and the upper electrode.

Additional layers can be further included between the lower electrode and the organic light-emitting layer and between the upper electrode and the organic light-emitting layer. The additional layer can include a hole transporting layer, a hole injecting layer, an electron injecting layer and an electron transporting layer for balancing electrons and holes, but is not limited thereto. The sealing substrate can be made of glass, metal, and/or a polymer, and can seal the lower electrode, the organic light-emitting layer, and the upper electrode to prevent moisture and/or oxygen from being introduced from the outside.

The elliptically polarizing plate can be disposed on the side where the light comes out from the organic light-emitting display panel. For example, in the case of a bottom emission structure in which light is emitted toward the base substrate, it can be disposed outside the base substrate, and in the case of a top emission structure in which light is emitted toward the sealing substrate, it can be disposed outside the sealing substrate. The elliptically polarizing plate can improve display characteristics of the organic light-emitting device by preventing external light from being reflected by the reflective layer made of metal such as electrodes and wiring of the organic light-emitting display panel and from coming out of the organic light-emitting device. In addition, since the elliptically polarizing plate can exhibit an antireflection effect on the side as well as the front, as described above, the lateral visibility can be improved.

The present application can provide an elliptically polarizing plate with superior visibility having excellent reflection characteristics and color characteristics on the side as well as the front, and an organic light-emitting device comprising the same.

Hereinafter, the present application will be described in detail by way of examples according to the present application and comparative examples not complying with the present application, but the scope of the present application is not limited by the following examples.

Evaluation Example 1 Evaluation of Color Characteristic Simulation

For Examples and Comparative Examples, the color characteristics (Techwiz 1D plus, Sanayi System Co., Ltd.) in the front and side were simulated and evaluated. The color differences ($\Delta E^*_{ab}$, dE) are defined by the following Equation 7:

$$\Delta E^*_{ab} = \sqrt{(L^*_1 - L^*_2)^2 + (a^*_1 - a^*_2)^2 + (b^*_1 - b^*_2)^2} \quad \text{[Equation 7]}$$

In Equation 7 above, $(L^*_1, a^*_1, b^*_1)$ mean reflection color values at the front (tilt angle 0°, azimuth angle 0°), and $(L^*_2, a^*_2, b^*_2)$ mean reflection color values at the side (specific tilt angle and azimuth angle). The dE max values were recorded based on the maximum value of dE values at a tilt angle of 40 degrees and an azimuth angle of 45 degrees or 135 degrees. The color difference value (dE value) shows how much the side color differs from the front color. If the $\Delta E^*_{ab}$ value is 2.3, it can be regarded as JND (just noticeable difference), and if the $\Delta E^*_{ab}$ value is less than 2.4, it can be said that the performance close to JND is realized.

Example 1

An elliptically polarizing plate comprising, sequentially, a polarizer, a first retardation film, a second retardation film, a third retardation film and a fourth retardation film was prepared, and the elliptically polarizing plate was disposed so that the fourth retardation film was adjacent to an OLED panel.

The polarizer was a linear polarizer having single transmittance (Ts) of 42.5%, and the OLED panel was a Galaxy S6 smartphone. The first retardation film was a −B plate, where its slow axis is perpendicular to the absorption axis of the polarizer. The second retardation film was a +C plate. The third retardation film had an R (450)/R (550) value of 0.86 and an Rin value of 140 nm, where its slow axis formed an angle of 45 degrees with the absorption axis of the polarizer. The fourth retardation film was a +C plate having an Rth value of 60 nm. Here, the Rin means an in-plane retardation value of a retardation film for light having a wavelength of 550 nm, and the Rth means a thickness direction retardation value of a retardation film for light having a wavelength of 550 nm.

When the Nz values of the first retardation film were 1.2, 3.0 and 6.0, Table 1, Table 2 and Table 3 show the optical properties of the first and second retardation films exhibiting dE Max values of less than 2.4 at a tilt angle of 40 degrees inclination angle, respectively.

TABLE 1

| First Retardation Film | | | Second Retardation Film | First and Second Retardation Films | dE Max @ a tilt |
|---|---|---|---|---|---|
| Nz | Rin | Rth | Rth | Rth total | angle of 40° |
| 1.2 | 52.5 | −10.5 | 65.5 | 55 | 2.39 |
| 1.2 | 52.5 | −10.5 | 68 | 57.5 | 2.39 |
| 1.2 | 55 | −11 | 68.5 | 57.5 | 2.36 |
| 1.2 | 55 | −11 | 71 | 60 | 2.37 |
| 1.2 | 57.5 | −11.5 | 69 | 57.5 | 2.37 |
| 1.2 | 57.5 | −11.5 | 71.5 | 60 | 2.34 |
| 1.2 | 57.5 | −11.5 | 74 | 62.5 | 2.35 |
| 1.2 | 57.5 | −11.5 | 76.5 | 65 | 2.40 |
| 1.2 | 60 | −12 | 72 | 60 | 2.34 |
| 1.2 | 60 | −12 | 74.5 | 62.5 | 2.33 |
| 1.2 | 60 | −12 | 77 | 65 | 2.35 |
| 1.2 | 60 | −12 | 79.5 | 67.5 | 2.39 |
| 1.2 | 62.5 | −12.5 | 72.5 | 60 | 2.37 |
| 1.2 | 62.5 | −12.5 | 75 | 62.5 | 2.34 |
| 1.2 | 62.5 | −12.5 | 77.5 | 65 | 2.33 |
| 1.2 | 62.5 | −12.5 | 80 | 67.5 | 2.35 |
| 1.2 | 62.5 | −12.5 | 82.5 | 70 | 2.40 |
| 1.2 | 65 | −13 | 75.5 | 62.5 | 2.37 |
| 1.2 | 65 | −13 | 78 | 65 | 2.34 |
| 1.2 | 65 | −13 | 80.5 | 67.5 | 2.34 |
| 1.2 | 65 | −13 | 83 | 70 | 2.36 |

TABLE 1-continued

| First Retardation Film | | | Second Retardation Film | First and Second Retardation Films | dE Max @ a tilt |
|---|---|---|---|---|---|
| Nz | Rin | Rth | Rth | Rth total | angle of 40° |
| 1.2 | 67.5 | −13.5 | 78.5 | 65 | 2.38 |
| 1.2 | 67.5 | −13.5 | 81 | 67.5 | 2.35 |
| 1.2 | 67.5 | −13.5 | 83.5 | 70 | 2.36 |
| 1.2 | 67.5 | −13.5 | 86 | 72.5 | 2.39 |
| 1.2 | 70 | −14 | 81.5 | 67.5 | 2.39 |
| 1.2 | 70 | −14 | 84 | 70 | 2.38 |
| 1.2 | 70 | −14 | 86.5 | 72.5 | 2.39 |

TABLE 2

| First Retardation Film | | | Second Retardation Film | First and Second Retardation Films | dE Max @ a tilt |
|---|---|---|---|---|---|
| Nz | Rin | Rth | Rth | Rth total | angle of 40° |
| 3 | 35 | −70 | 125 | 55 | 2.40 |
| 3 | 37.5 | −75 | 130 | 55 | 2.39 |
| 3 | 37.5 | −75 | 132.5 | 57.5 | 2.37 |
| 3 | 37.5 | −75 | 135 | 60 | 2.37 |
| 3 | 37.5 | −75 | 137.5 | 62.5 | 2.39 |
| 3 | 40 | −80 | 140 | 60 | 2.38 |
| 3 | 40 | −80 | 142.5 | 62.5 | 2.36 |
| 3 | 40 | −80 | 145 | 65 | 2.36 |
| 3 | 40 | −80 | 147.5 | 67.5 | 2.38 |
| 3 | 42.5 | −85 | 150 | 65 | 2.39 |
| 3 | 42.5 | −85 | 152.5 | 67.5 | 2.37 |
| 3 | 42.5 | −85 | 155 | 70 | 2.37 |
| 3 | 42.5 | −85 | 157.5 | 72.5 | 2.39 |
| 3 | 45 | −90 | 162.5 | 72.5 | 2.40 |
| 3 | 45 | −90 | 165 | 75 | 2.40 |

TABLE 3

| First Retardation Film | | | Second Retardation Film | First and Second Retardation Films | dE Max @ a tilt |
|---|---|---|---|---|---|
| Nz | Rin | Rth | Rth | Rth total | angle of 40° |
| 6 | 30 | −150 | 250 | 100 | 2.40 |
| 6 | 30 | −150 | 252.5 | 102.5 | 2.39 |
| 6 | 30 | −150 | 255 | 105 | 2.40 |

Example 2

The same structure as that of Example 1 was set up, except that the first retardation film and the second retardation film were each changed as follows.

The first retardation film was a −B plate, where its slow axis is perpendicular to the absorption axis of the polarizer. The second retardation film was a +B plate, where its slow axis is parallel to the absorption axis of the polarizer.

When the Nz values of the first retardation film were 1.2 and 6.0, Table 4 and Table 5 show the optical properties of the first and second retardation films exhibiting dE Max values of less than 2.4 at a tilt angle of 40 degrees, respectively.

TABLE 4

| First Retardation Film | | | Second Retardation Film | | | First and Second Retardation Films | dE Max @ a tilt |
|---|---|---|---|---|---|---|---|
| Nz | Rin | Rth | Nz | Rin | Rth | Rth total | angle of 40° |
| 1.2 | 65 | −13 | −1.5 | 29.2 | 73 | 60 | 2.36 |
| 1.2 | 65 | −13 | −1.5 | 31.2 | 78 | 65 | 2.20 |
| 1.2 | 65 | −13 | −1.5 | 33.2 | 83 | 70 | 2.16 |
| 1.2 | 65 | −13 | −1.5 | 35.2 | 88 | 75 | 2.27 |
| 1.2 | 65 | −13 | −2.5 | 20.9 | 73 | 60 | 2.26 |
| 1.2 | 65 | −13 | −2.5 | 22.3 | 78 | 65 | 2.13 |
| 1.2 | 65 | −13 | −2.5 | 23.7 | 83 | 70 | 2.14 |
| 1.2 | 65 | −13 | −2.5 | 25.1 | 88 | 75 | 2.29 |
| 1.2 | 65 | −13 | −3.5 | 16.2 | 73 | 60 | 2.21 |
| 1.2 | 65 | −13 | −3.5 | 17.3 | 78 | 65 | 2.11 |
| 1.2 | 65 | −13 | −3.5 | 18.4 | 83 | 70 | 2.16 |
| 1.2 | 65 | −13 | −3.5 | 19.6 | 88 | 75 | 2.36 |
| 1.2 | 65 | −13 | −4.5 | 12.4 | 68 | 55 | 2.39 |
| 1.2 | 65 | −13 | −4.5 | 13.3 | 73 | 60 | 2.19 |
| 1.2 | 65 | −13 | −4.5 | 14.2 | 78 | 65 | 2.12 |
| 1.2 | 65 | −13 | −4.5 | 15.1 | 83 | 70 | 2.20 |

TABLE 5

| First Retardation Film | | | Second Retardation Film | | | First and Second Retardation Films | dE Max @ a tilt |
|---|---|---|---|---|---|---|---|
| Nz | Rin | Rth | Nz | Rin | Rth | Rth total | angle of 40° |
| 6 | 30 | −150 | −1 | 40.0 | 80 | −70 | 2.26 |
| 6 | 30 | −150 | −1 | 45.0 | 90 | −60 | 2.39 |
| 6 | 30 | −150 | −2 | 26.7 | 80 | −70 | 2.13 |
| 6 | 30 | −150 | −2 | 30.0 | 90 | −60 | 2.36 |
| 6 | 30 | −150 | −3 | 17.5 | 70 | −80 | 2.36 |
| 6 | 30 | −150 | −3 | 20.0 | 80 | −70 | 2.11 |
| 6 | 30 | −150 | −4 | 14.0 | 70 | −80 | 2.31 |
| 6 | 30 | −150 | −4 | 16.0 | 80 | −70 | 2.12 |
| 6 | 30 | −150 | −5 | 11.7 | 70 | −80 | 2.28 |
| 6 | 30 | −150 | −5 | 13.3 | 80 | −70 | 2.14 |
| 6 | 30 | −150 | −6 | 10.0 | 70 | −80 | 2.27 |
| 6 | 30 | −150 | −6 | 11.4 | 80 | −70 | 2.16 |
| 6 | 30 | −150 | −7 | 8.8 | 70 | −80 | 2.26 |
| 6 | 30 | −150 | −7 | 10.0 | 80 | −70 | 2.18 |
| 6 | 30 | −150 | −8 | 7.8 | 70 | −80 | 2.25 |
| 6 | 30 | −150 | −8 | 8.9 | 80 | −70 | 2.19 |
| 6 | 30 | −150 | −9 | 7.0 | 70 | −80 | 2.24 |
| 6 | 30 | −150 | −9 | 8.0 | 80 | −70 | 2.21 |
| 6 | 30 | −150 | −10 | 6.4 | 70 | −80 | 2.24 |
| 6 | 30 | −150 | −10 | 7.3 | 80 | −70 | 2.22 |
| 6 | 30 | −150 | −11 | 5.8 | 70 | −80 | 2.24 |
| 6 | 30 | −150 | −11 | 6.7 | 80 | −70 | 2.23 |
| 6 | 30 | −150 | −12 | 5.4 | 70 | −80 | 2.23 |
| 6 | 30 | −150 | −12 | 6.2 | 80 | −70 | 2.24 |
| 6 | 30 | −150 | −13 | 5.0 | 70 | −80 | 2.23 |
| 6 | 30 | −150 | −13 | 5.7 | 80 | −70 | 2.25 |
| 6 | 30 | −150 | −14 | 4.7 | 70 | −80 | 2.23 |
| 6 | 30 | −150 | −14 | 5.3 | 80 | −70 | 2.25 |
| 6 | 30 | −150 | −15 | 4.4 | 70 | −80 | 2.23 |
| 6 | 30 | −150 | −15 | 5.0 | 80 | −70 | 2.26 |
| 6 | 30 | −150 | −16 | 4.1 | 70 | −80 | 2.23 |
| 6 | 30 | −150 | −16 | 4.7 | 80 | −70 | 2.27 |
| 6 | 30 | −150 | −17 | 3.9 | 70 | −80 | 2.23 |
| 6 | 30 | −150 | −17 | 4.4 | 80 | −70 | 2.27 |
| 6 | 30 | −150 | −18 | 3.7 | 70 | −80 | 2.23 |
| 6 | 30 | −150 | −18 | 4.2 | 80 | −70 | 2.28 |
| 6 | 30 | −150 | −19 | 3.5 | 70 | −80 | 2.23 |
| 6 | 30 | −150 | −19 | 4.0 | 80 | −70 | 2.28 |
| 6 | 30 | −150 | −20 | 3.3 | 70 | −80 | 2.23 |
| 6 | 30 | −150 | −20 | 3.8 | 80 | −70 | 2.29 |

Example 3

The same structure as that of Example 1 was set up, except that the first retardation film and the second retardation film were each changed as follows.

The first retardation film was a −B plate, where its slow axis is perpendicular to the absorption axis of the polarizer. The second retardation film was a +B plate, where its slow axis is perpendicular to the absorption axis of the polarizer.

When the Nz values of the first retardation film were 1.2 and 6.0, Table 6 and Table 7 show optical properties of the first and second retardation films exhibiting dE Max values of less than 2.4 at a tilt angle of 40 degrees, respectively.

TABLE 6

| First Retardation Film | | | Second Retardation Film | | | First and Second Retardation Films | dE Max @ a tilt |
|---|---|---|---|---|---|---|---|
| Nz | Rin | Rth | Nz | Rin | Rth | Rth total | angle of 40° |
| 1.2 | 65 | −13 | −5 | 13.0 | 78 | 65 | 2.37 |
| 1.2 | 65 | −13 | −5 | 13.4 | 80.5 | 67.5 | 2.38 |
| 1.2 | 65 | −13 | −7.5 | 8.6 | 73 | 60 | 2.36 |
| 1.2 | 65 | −13 | −7.5 | 8.9 | 75.5 | 62.5 | 2.32 |
| 1.2 | 65 | −13 | −7.5 | 9.2 | 78 | 65 | 2.31 |
| 1.2 | 65 | −13 | −7.5 | 9.5 | 80.5 | 67.5 | 2.34 |
| 1.2 | 65 | −13 | −10 | 6.4 | 70.5 | 57.5 | 2.38 |
| 1.2 | 65 | −13 | −10 | 6.6 | 73 | 60 | 2.31 |
| 1.2 | 65 | −13 | −10 | 6.9 | 75.5 | 62.5 | 2.28 |
| 1.2 | 65 | −13 | −10 | 7.1 | 78 | 65 | 2.29 |
| 1.2 | 65 | −13 | −10 | 7.3 | 80.5 | 67.5 | 2.34 |
| 1.2 | 65 | −13 | −12.5 | 5.2 | 70.5 | 57.5 | 2.34 |
| 1.2 | 65 | −13 | −12.5 | 5.4 | 73 | 60 | 2.29 |
| 1.2 | 65 | −13 | −12.5 | 5.6 | 75.5 | 62.5 | 2.27 |
| 1.2 | 65 | −13 | −12.5 | 5.8 | 78 | 65 | 2.28 |
| 1.2 | 65 | −13 | −12.5 | 6.0 | 80.5 | 67.5 | 2.34 |
| 1.2 | 65 | −13 | −15 | 4.4 | 70.5 | 57.5 | 2.32 |
| 1.2 | 65 | −13 | −15 | 4.6 | 73 | 60 | 2.27 |
| 1.2 | 65 | −13 | −15 | 4.7 | 75.5 | 62.5 | 2.25 |
| 1.2 | 65 | −13 | −15 | 4.9 | 78 | 65 | 2.28 |
| 1.2 | 65 | −13 | −15 | 5.0 | 80.5 | 67.5 | 2.34 |
| 1.2 | 65 | −13 | −17.5 | 3.7 | 68 | 55 | 2.38 |
| 1.2 | 65 | −13 | −17.5 | 3.8 | 70.5 | 57.5 | 2.30 |
| 1.2 | 65 | −13 | −17.5 | 3.9 | 73 | 60 | 2.26 |
| 1.2 | 65 | −13 | −17.5 | 4.1 | 75.5 | 62.5 | 2.25 |
| 1.2 | 65 | −13 | −17.5 | 4.2 | 78 | 65 | 2.28 |
| 1.2 | 65 | −13 | −17.5 | 4.4 | 80.5 | 67.5 | 2.35 |
| 1.2 | 65 | −13 | −20 | 3.2 | 68 | 55 | 2.37 |
| 1.2 | 65 | −13 | −20 | 3.4 | 70.5 | 57.5 | 2.29 |
| 1.2 | 65 | −13 | −20 | 3.5 | 73 | 60 | 2.25 |
| 1.2 | 65 | −13 | −20 | 3.6 | 75.5 | 62.5 | 2.24 |
| 1.2 | 65 | −13 | −20 | 3.7 | 78 | 65 | 2.28 |
| 1.2 | 65 | −13 | −20 | 3.8 | 80.5 | 67.5 | 2.35 |

TABLE 7

| First Retardation Film | | | Second Retardation Film | | | First + Second Retardation Films | dE Max @ a tilt |
|---|---|---|---|---|---|---|---|
| Nz | Rin | Rth | Nz | Rin | Rth | Rth total | angle of 40° |
| 6 | 30 | −150 | −5 | 13.3 | 80 | −70 | 2.37 |
| 6 | 30 | −150 | −6 | 11.4 | 80 | −70 | 2.35 |
| 6 | 30 | −150 | −7 | 10.0 | 80 | −70 | 2.34 |
| 6 | 30 | −150 | −8 | 8.9 | 80 | −70 | 2.33 |
| 6 | 30 | −150 | −9 | 8.0 | 80 | −70 | 2.33 |
| 6 | 30 | −150 | −10 | 6.4 | 70 | −80 | 2.39 |
| 6 | 30 | −150 | −10 | 7.3 | 80 | −70 | 2.32 |
| 6 | 30 | −150 | −11 | 5.8 | 70 | −80 | 2.38 |
| 6 | 30 | −150 | −11 | 6.7 | 80 | −70 | 2.32 |
| 6 | 30 | −150 | −12 | 5.4 | 70 | −80 | 2.36 |

TABLE 7-continued

| First Retardation Film | | | Second Retardation Film | | | First + Second Retardation Films | dE Max @ a tilt |
| --- | --- | --- | --- | --- | --- | --- | --- |
| Nz | Rin | Rth | Nz | Rin | Rth | Rth total | angle of 40° |
| 6 | 30 | −150 | −12 | 6.2 | 80 | −70 | 2.33 |
| 6 | 30 | −150 | −13 | 5.0 | 70 | −80 | 2.35 |
| 6 | 30 | −150 | −13 | 5.7 | 80 | −70 | 2.33 |
| 6 | 30 | −150 | −14 | 4.7 | 70 | −80 | 2.34 |
| 6 | 30 | −150 | −14 | 5.3 | 80 | −70 | 2.33 |
| 6 | 30 | −150 | −15 | 4.4 | 70 | −80 | 2.33 |
| 6 | 30 | −150 | −15 | 5.0 | 80 | −70 | 2.33 |
| 6 | 30 | −150 | −16 | 4.1 | 70 | −80 | 2.33 |
| 6 | 30 | −150 | −16 | 4.7 | 80 | −70 | 2.33 |
| 6 | 30 | −150 | −17 | 3.9 | 70 | −80 | 2.32 |
| 6 | 30 | −150 | −17 | 4.4 | 80 | −70 | 2.33 |
| 6 | 30 | −150 | −18 | 3.7 | 70 | −80 | 2.31 |
| 6 | 30 | −150 | −18 | 4.2 | 80 | −70 | 2.33 |
| 6 | 30 | −150 | −19 | 3.5 | 70 | −80 | 2.31 |
| 6 | 30 | −150 | −19 | 4.0 | 80 | −70 | 2.34 |
| 6 | 30 | −150 | −20 | 3.3 | 70 | −80 | 2.30 |
| 6 | 30 | −150 | −20 | 3.8 | 80 | −70 | 2.34 |

Comparative Example 1

The same structure as that of Example 1 was set up, except that the elliptically polarizing plate comprising the polarizer, the third retardation film and the fourth retardation film sequentially was set without comprising the first retardation film and the second retardation film. The dE max value of Comparative Example 1 was 2.8.

REFERENCE NUMERALS USED HEREIN

10: first retardation film
20: second retardation film
30: third retardation film
40: fourth retardation film
50: linear polarizer
100: elliptically polarizing plate
200: organic light-emitting display panel

The invention claimed is:

1. An elliptically polarizing plate comprising, sequentially, a linear polarizer, a first retardation film, a second retardation film, a third retardation film and a fourth retardation film,
   wherein the first retardation film is a −B plate having an Nz value of more than 1 in Equation 1:

$$Nz=(nx-nz)/(nx-ny),$$ [Equation 1]

wherein the second retardation film is a +B plate having an Nz value of less than 0 in Equation 1, or a +C plate satisfying Expression 1:

$$nx=ny<nz,$$ [Expression 1]

wherein the third retardation film has an Nz value of 0.8 to 1.2 in Equation 1, and wherein an in-plane slow axis of the third retardation film forms an angle of 43 degrees to 47 degrees with an absorption axis of the linear polarizer,
   wherein the fourth retardation film is a +B plate having a Nz value of −4.0 or less in Equation 1, or a +C plate satisfying Expression 1, and
   wherein a sum of a thickness direction retardation value of the first retardation film and a thickness direction retardation value of the second retardation film is in a range of −100 nm to 130 nm and a thickness direction retardation value (Rth) is calculated according to Equation 2:

$$Rth=(nz-ny)\times d,$$ [Equation 2]

wherein, nx, ny and nz are refractive indexes of the first to fourth retardation films in x-axis, y-axis and z-axis directions, respectively, and
   wherein the x-axis is a direction parallel to an in-plane slow axis of the first to fourth retardation films, the y-axis is a direction parallel to an in-plane fast axis of each of the first to fourth retardation films, the z-axis is a thickness direction of the first to fourth retardation films, and d is a thickness of the first to fourth retardation films.

2. The elliptically polarizing plate according to claim 1, wherein the Nz value of the first retardation film is from 1.2 to 6.

3. The elliptically polarizing plate according to claim 1, wherein the first retardation film has an in-plane retardation value of 10 nm to 90 nm for light having a wavelength of 550 nm.

4. The elliptically polarizing plate according to claim 1, wherein the thickness direction retardation value of the first retardation film is −160 nm to −5 nm.

5. The elliptically polarizing plate according to claim 1, wherein the in-plane slow axis of the first retardation film is perpendicular to the absorption axis of the linear polarizer.

6. The elliptically polarizing plate according to claim 1, wherein the first retardation film has a R (450)/R (550) value of 0.6 to 1.3, wherein R (λ) is an in-plane retardation value of the first retardation film for light with having a wavelength of λnm.

7. The elliptically polarizing plate according to claim 1, wherein the second retardation film is a +B plate having an Nz value of −1 or less.

8. The elliptically polarizing plate according to claim 1, wherein the second retardation film is a +B plate having an in-plane retardation value of 0 nm to 60 nm for light having a wavelength of 550 nm.

9. The elliptically polarizing plate according to claim 1, wherein the second retardation film is a +B plate and the thickness direction retardation value of the +B plate is from 30 nm to 120 nm.

10. The elliptically polarizing plate according to claim 1, wherein the second retardation film is a +B plate, and wherein the in-plane slow axis of the second retardation film is perpendicular or parallel to the absorption axis of the linear polarizer.

11. The elliptically polarizing plate according to claim 1, wherein the second retardation film is a +C plate having a thickness direction retardation value of 10 nm to 300 nm.

12. The elliptically polarizing plate according to claim 1, wherein the second retardation film has an R (450)/R (550) value of 0.6 to 1.3 or an Rth (450)/Rth (550) value of 0.6 to 1.3, wherein R (λ) is an in-plane retardation value of the second retardation film for light having a wavelength of λ nm, and Rth (λ) is the thickness direction retardation value of the second retardation film for light having a wavelength of λ nm.

13. The elliptically polarizing plate according to claim 1, wherein the third retardation film has an in-plane retardation value of 130 nm to 150 nm for light having a wavelength of 550 nm.

14. The elliptically polarizing plate according to claim 1, wherein the third retardation film has an R (450)/R (550)

value of 0.6 to 1.0, wherein R (λ) is an in-plane retardation value of the third retardation film for light having a wavelength of λ nm.

15. The elliptically polarizing plate according to claim 1, wherein the thickness direction retardation value of the fourth retardation film is from 0 nm to 300 nm.

16. The elliptically polarizing plate according to claim 1, wherein the fourth retardation film has a Rth (450)/Rth (550) value of 0.6 to 1.3, wherein Rth (λ) a thickness direction retardation value of the fourth retardation film for light having a wavelength of λ nm.

17. An organic light-emitting device comprising the elliptically polarizing plate of claim 1 and an organic light-emitting display panel.

18. The organic light-emitting device according to claim 17, wherein the fourth retardation film of the elliptically polarizing plate is disposed adjacent to the organic light-emitting display panel.

\* \* \* \* \*